United States Patent
Shiraishi et al.

(10) Patent No.: US 7,816,690 B2
(45) Date of Patent: Oct. 19, 2010

(54) LIGHT-EMITTING DEVICE

(75) Inventors: Akinori Shiraishi, Nagano (JP); Yuichi Taguchi, Nagano (JP); Kei Murayama, Nagano (JP); Masahiro Sunohara, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 481 days.

(21) Appl. No.: 11/882,812

(22) Filed: Aug. 6, 2007

(65) Prior Publication Data

US 2008/0030139 A1 Feb. 7, 2008

(30) Foreign Application Priority Data

Aug. 7, 2006 (JP) .............................. 2006-214700

(51) Int. Cl.
*H01L 27/15* (2006.01)
*H01L 29/22* (2006.01)

(52) U.S. Cl. .............................. 257/81; 257/98; 257/99; 257/431; 257/778; 257/E25.032

(58) Field of Classification Search .................. 257/81, 257/98, 99, E25.032, 431, 778
See application file for complete search history.

(56) References Cited

U.S. PATENT DOCUMENTS

| | | | | |
|---|---|---|---|---|
| 5,298,768 | A  * | 3/1994 | Okazaki et al. | 257/81 |
| 6,730,939 | B2 * | 5/2004 | Eisert et al. | 257/98 |
| 7,423,284 | B2 * | 9/2008 | Nagai et al. | 257/21 |
| 7,482,696 | B2 * | 1/2009 | Shei et al. | 257/778 |
| 7,551,329 | B2 * | 6/2009 | Yoshikawa | 358/474 |
| 7,579,629 | B2 * | 8/2009 | Inoguchi | 257/98 |
| 2002/0008325 | A1 * | 1/2002 | Tominaga | 257/778 |
| 2002/0121706 | A1 * | 9/2002 | Tatsuta et al. | 257/778 |
| 2004/0065894 | A1 * | 4/2004 | Hashimoto et al. | 257/100 |
| 2005/0017258 | A1 * | 1/2005 | Fehrer et al. | 257/98 |
| 2006/0102917 | A1 * | 5/2006 | Oyama et al. | 257/99 |

FOREIGN PATENT DOCUMENTS

| | | |
|---|---|---|
| JP | 2005-203448 | 7/2005 |
| JP | 2005-244147 | 9/2005 |

* cited by examiner

*Primary Examiner*—Nitin Parekh
(74) *Attorney, Agent, or Firm*—Drinker Biddle & Reath LLP

(57) ABSTRACT

A light-emitting device includes a light-emitting element 12 and a wiring substrate 11 having a substrate body 17 having a protruding portion 25 at a position where the light-emitting device 12 is disposed and wiring patterns 21 and 22 disposed on the substrate body 17 and electrically connected to the light-emitting element 12.

5 Claims, 4 Drawing Sheets

LIGHT-EMITTING DEVICE

BACKGROUND OF THE INVENTION

The present invention relates to a light-emitting device, and more particularly, to a light-emitting device which can effectively use light from a light-emitting element connected to a wiring substrate.

FIG. 1 is a sectional view illustrating a known light-emitting device.

Referring to FIG. 1, a light-emitting device 100 includes a light-emitting element 101, a sub-mount substrate 102, a board substrate 103, external connection terminals 104 and 105, and a heat-sinking plate 107.

The light-emitting element 101 is an element which emits light from the entire surface thereof. The light-emitting element 101 has power supply terminals 111 and 112. The light-emitting element 101 is connected to the sub-mount substrate 102 in a flip-chip bonding manner.

However, the sub-mount substrate is fixed to the board substrate 103 by the use of a bonding method using an Au—Sn alloy which has thermal conductivity higher than solder. The sub-mount substrate 102 includes a substrate body 114 and wiring patterns 115 and 116. The substrate body 114 serves to mount the wiring patterns 115 and 116 thereon. The substrate body 114 can be made of a material having high thermal conductivity, such as AlN.

The wiring patterns 115 and 116 are formed on the substrate body 114. The wiring pattern 115 is electrically connected to the power supply terminal 111 via a bump 118 and the wiring pattern 116 is electrically connected to the power supply terminal 112 via a bump 118. The sub-mount substrate 102 serves to raise the light-emitting element 101 so as to protrude higher than the top surfaces 104A and 105A of portions of the external connection leads 104 and 105, in which the portions are disposed on the board substrate 103.

In such a configuration, since the light-emitting element 101 is raised to protrude higher than the top surfaces 104A and 105B of the external connection leads 104 and 105 disposed on the board substrate 103, it is therefore possible to effectively use light emitted from the entire surface of the light-emitting element 101.

The board substrate 103 includes a substrate body 121 and wiring patterns 122 and 123. The substrate body 121 serves to mount the wiring patterns 122 and 123 thereon. The substrate body 121 can be made of a material having high thermal conductivity, such as AlN or ceramic. The wiring patterns 122 and 123 are disposed on the substrate body 121. The wiring pattern 122 is electrically connected to the wiring pattern 115 via a wire 125A. The wiring pattern 123 is electrically connected to the wiring pattern 116 via a wire 125B. That is, the sub-mount substrate 102 is connected to the board substrate 103 in a wire bonding manner.

The external connection terminal 104 is fixed onto the wiring pattern 122 using Ag paste 127 as an adhesive. The external connection lead 105 is fixed onto the wiring pattern 123 using the Ag paste 127 as an adhesive.

The heat-sinking plate 107 is fixed onto the bottom surface of the substrate body 121 by using Ag paste. The heat-sinking plate 107 serves to release heat, which is generated when the light-emitting element 101 emits light, outside the light-emitting device 100. The heat which is generated when the light-emitting element 101 emits light is transmitted to the heat-sinking plate 107 via the sub-mount substrate 102 and the board substrate 103 (see Patent Document 1).

[Patent Document 1]

Unexamined Japanese Patent Application Publication No. 2005-203448

However, the related-art light-emitting device 100 has a problem with increase in cost because the sub-mount substrate 102 is fixed to the board substrate 103 using an expensive material of an Au—Sn alloy by the use of an Au—Sn bonding method.

SUMMARY OF THE INVENTION

Accordingly, it is an object of the invention to provide a light-emitting device which can effectively use light emitted from the entire surface of a light-emitting element and can reduce the cost thereof.

According to an aspect of the invention, there is provided a light-emitting device including:

a light-emitting element, a substrate body, and a wiring substrate having a wiring pattern formed on the substrate body and electrically connected to the light-emitting element, wherein the substrate body has a protruding portion at a position where the light-emitting element is disposed.

In the above-mentioned configuration, the sub-mount substrate provided in the related-art light-emitting device becomes unnecessary because the light-emitting device uses the substrate body having the protruding portion at the position where the light-emitting element is disposed. It is therefore possible to effectively use light emitted from the entire surface of the light-emitting element while reducing the cost thereof. In addition, since the Au—Sn bonding method which incurs high cost becomes unnecessary, the cost of the light-emitting device can be reduced.

According to another aspect of the invention, there is provided a light-emitting device including:

a light-emitting element having a first power supply terminal and a second power supply terminal; and a substrate body on which the light-emitting element is disposed, wherein the substrate body has a protruding portion at a position where the light-emitting element is disposed, a wiring pattern electrically connected to the first power supply terminal is formed on a surface of the substrate body on which the protruding portion is disposed, a penetrating electrode which penetrates the substrate body is formed in the protruding portion, and the penetrating electrode is electrically connected to the second power supply terminal.

In such configurations, the substrate body having the protruding portion at the position where the light-emitting element is disposed is provided, the wiring pattern electrically connected to the first power supply terminal is formed on the surface of the substrate body on which the protruding portion is disposed, the penetrating electrode which penetrates the substrate body is formed in the protruding portion, and the penetrating electrode is electrically connected to the second power supply terminal. Accordingly, it is possible to effectively use light emitted from the entire surface of the light-emitting element and it is possible to reduce the size of the substrate body, resulting in cost reduction of the light-emitting device.

According to the invention, light emitted from the entire surface of the light-emitting element can be effectively used and the cost of the light-emitting device can be reduced.

DETAILED DESCRIPTION OF THE PREFERRED EMBODIMENTS

Next, preferred embodiments of the invention will be described with reference to the accompanying drawings.

First Embodiment

Figure 2:
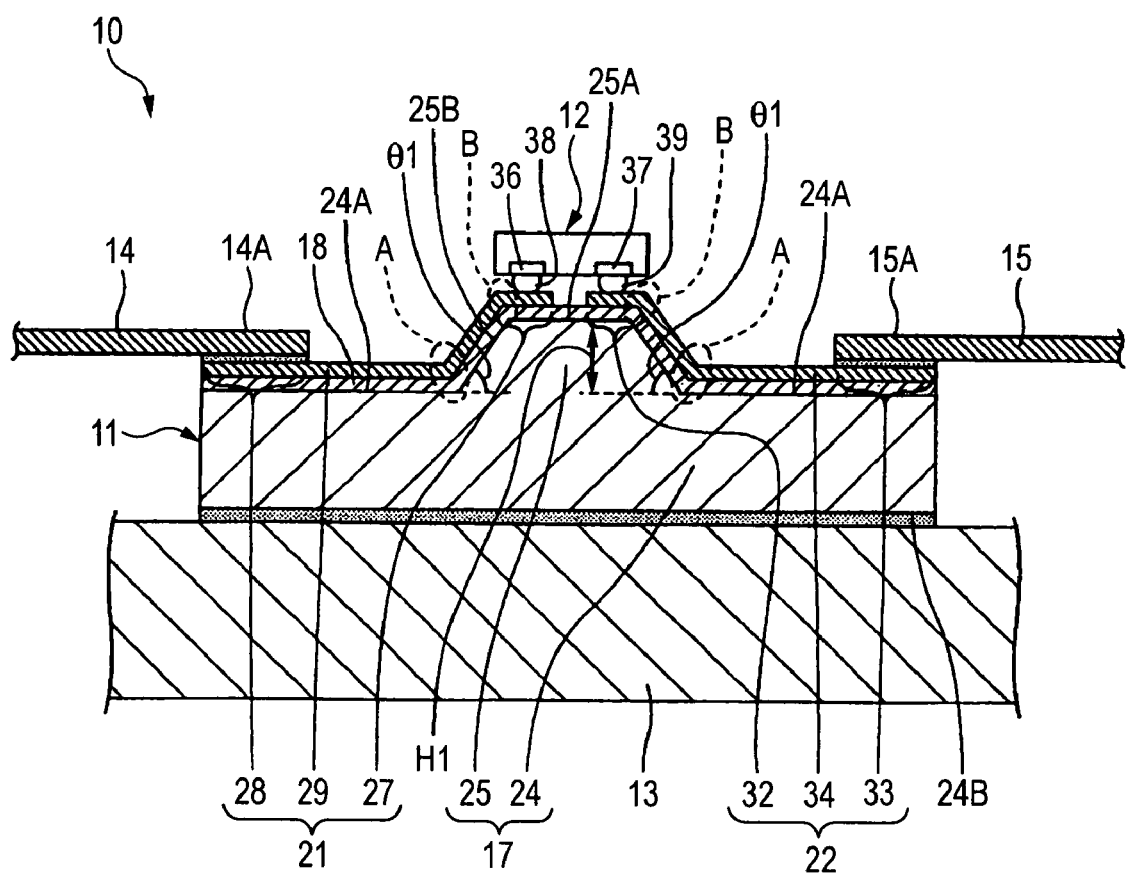
FIG. 2 is a sectional view illustrating a light-emitting device according to a first embodiment of the invention.

FIG. 2 is a cross-sectional view illustrating a light-emitting device according to a first embodiment of the invention.

Referring to FIG. 2, the light-emitting device 100 according to the first embodiment of the invention includes a wiring substrate 11, a light-emitting element 12, a heat-sinking plate 13 and external connection leads 14 and 15. The wiring substrate 11 includes a substrate body 17, an insulation layer 18, a first wiring pattern 21 and a second wiring pattern 22.

The substrate body 17 comprises a substrate portion 21 and a protruding portion 25. The protruding portion 25 is integrated into the substrate portion 24. The protruding portion 25 is formed on the top surface 24A of the substrate portion 24 and protrudes from the top surface 24A of the substrate portion 24. The top surface 25A of the protruding portion 25 protrudes higher than the top surface 14A of the external connection lead 14 disposed on the first wiring pattern 21 and the top surface 15A of external connection lead 15 disposed on the second wiring pattern 22.

The protruding portion 25 serves to enable the light-emitting element 12 to be positioned higher than the top surface 14A of the external connection lead 14 and the top surface 15A of the external connection lead 15 at positions where the external connection leads 14 and 15 are disposed on the first wiring pattern 21 and the second wiring pattern 22, respectively. A height H1 (height measured when the top surface 24A of the substrate portion 24 is a base level) of the protruding portion 25 can be about 400 μm.

As described above, by providing the protruding portion 25 on the substrate body 17 in order to enable the light-emitting element 12 so as to be positioned higher than the top surface 14A of the external connection lead 14 formed on the first wiring pattern 21 and the top surface 15A of the external connection lead 15 formed on the second wiring pattern 22, the sub-mount substrate 102 provided in the related-art light-emitting device 100 becomes unnecessary. As a result, light emitted from the entire surface of the light-emitting element 12 can be effectively used. In addition, there is no necessity that the light-emitting device 10 use two substrates (the sub-mount substrate 102 and the board substrate 103) like the related-art light-emitting device 100. That is, a single substrate (the wiring substrate 11) is enough to use for the light-emitting device 10. Accordingly, the cost of the light-emitting device 10 can be reduced.

The protruding portion 25 takes a form of which a width decreases toward an upper portion (the top surface 25A of the protruding portion 25) from a lower portion thereof. A side surface 25B of the protruding portion 25 is an inclined surface inclined at an angle of θ1 with respect to the top surface 24A of the substrate portion 24. The angle θ1 can be, for example, 54.7° or 90°.

In such configuration, since the side surface 25B of the protruding portion 25 is an inclined surface, it is possible to alleviate stress concentrating on the first and second wiring patterns 21 and 22 formed on stepped portions A and B. As a result, it is possible to prevent the first and second wiring patterns 21 and 22 from breaking (for example, wire disconnection)

A material for the substrate body 17 can be silicon. An advantage of using silicon as a material for the substrate body 17 is that it is easy to form the protruding portion 25 having the inclined side surface 25B.

The insulation layer is formed on the top surface 24A of the substrate portion 24 and the top surface 25A and the side surface 25B of the protruding portion 25. The insulation layer 18 serves to insulate the first and second wiring patterns 21 and 22 from the substrate body 17.

The first wiring pattern 21 comprises a light-emitting element connection pad 27, a lead connection portion 28 and a wiring portion 29. The light-emitting element connection pad 27 is disposed on the insulation layer 18 formed on the top surface 25A of the protruding portion 25. The light-emitting element connection pad 27 is electrically connected to the first power supply terminal 36 of the light-emitting element 12.

The lead connection portion 28 is disposed on the insulation layer 18 formed on the top surface 24A of the substrate portion 24. The lead connection portion 28 is electrically connected to the external connection lead 14.

The wiring portion 29 is disposed on the insulation layer 18 formed on the side surface 25B of the protruding portion 25 and the top surface 24A of the substrate portion 24. The wiring portion 29 is connected to the light-emitting element connection pad 27 at an end thereof and connected to the lead connection portion 28 at the other end thereof. The wiring portion 29 serves to electrically connect the light-emitting element pad 27 with the lead connection portion 28.

The second wiring pattern 22 comprises a light-emitting element connection pad 32, a lead connection portion 33 and a wiring portion 34. The light-emitting element connection pad 32 is disposed on the insulation layer 18 formed on the top surface 25A of the protruding portion 25. The light-emitting element connection pad 32 is electrically connected to the second power supply terminal 37 of the light-emitting element 12.

The lead connection portion 33 is disposed on the insulation layer 18 formed on the top surface 24A of the substrate portion 24. The lead connection portion 33 is electrically connected to the external connection lead 15.

The wiring portion 34 is disposed on the insulation layer 18 formed on the side surface 25B of the protruding portion and the top surface 24A of the substrate portion 24. The wiring portion 34 is connected to the light-emitting element connection pad 32 at an end thereof and connected to the lead connection portion 33 at the other end thereof. The wiring portion 34 serves to electrically connect the light-emitting element connection pad 32 with the lead connection portion 33.

The light-emitting element 12 is an element which emits light from the entire surface thereof. The light-emitting element 12 has a first power supply terminal 36 and a second power supply terminal 37. The first power supply terminal 36 is electrically connected to the light-emitting element connection pad 27 via a bump 38. The second power supply terminal 37 is electrically connected to the light-emitting element connection pad 32 via a bump 39. That is, the light-emitting element 12 is connected to the first and second wiring patterns 21 and 22 in a flip-chip bonding manner.

The light-emitting element 12 is disposed at a position higher than the top surface 14A of the external connection lead 14 and the top surface 15A of the external connection lead 15 at positions where the external connection lead 14 and the external connection lead 15 are connected to the first wiring pattern 21 and the second wiring pattern 22, respectively.

As described above, since the light-emitting element 12 is disposed to be higher than the top surface 14A of the portion of the external connection lead 14, the portion connected to the first wiring pattern 21, and than the top surface 15A of the portion of the external connection lead 15, the portion connected to the second wiring pattern 22, light emitted from the entire surface of the light-emitting element 12 can be used effectively.

The heat-sinking plate is attached to the bottom surface 24B of the substrate portion 24 using Ag paste as an adhesive. Accordingly, it is possible to release the heat generated when the light-emitting element 12 emits light since the heat-sinking plate 13 is installed on the bottom surface 24B of the substrate portion 24.

The external connection lead 14 is attached to the lead connection portion 28 using Ag paste as an adhesive. The external connection lead 14 is electrically connected to the first power supply terminal 36 via the first wiring pattern 21.

The external connection lead 15 is electrically connected to the second power supply terminal 37 via the second wiring pattern 22. The external connection leads 14 and 15 are connected to a not-shown power supply source.

In such configurations, since the protruding portion 25 which enables the light-emitting element 12 to protrude higher than the upper faces 14A and 15A of the external connection leads 14 and 15 connected to the wiring substrate 11 is installed on the substrate body 17, the sub-mount substrate provided in the related-art light-emitting device 100 becomes unnecessary. As a result, light from the light-emitting element 12 can be effectively used. In addition, in the case of the light-emitting device 10, there is no necessity to use two substrates (the sub-mount substrate 102 and the board substrate 103) unlike the related-art light-emitting device 100. That is, a single substrate (the wiring substrate 11) is enough to use. As a result, the cost of the light-emitting device 10 can be reduced.

The Au—Sn bonding method which incurs high cost becomes unnecessary. Accordingly, the cost of the light-emitting device 10 can be further reduced.

Figure 1:
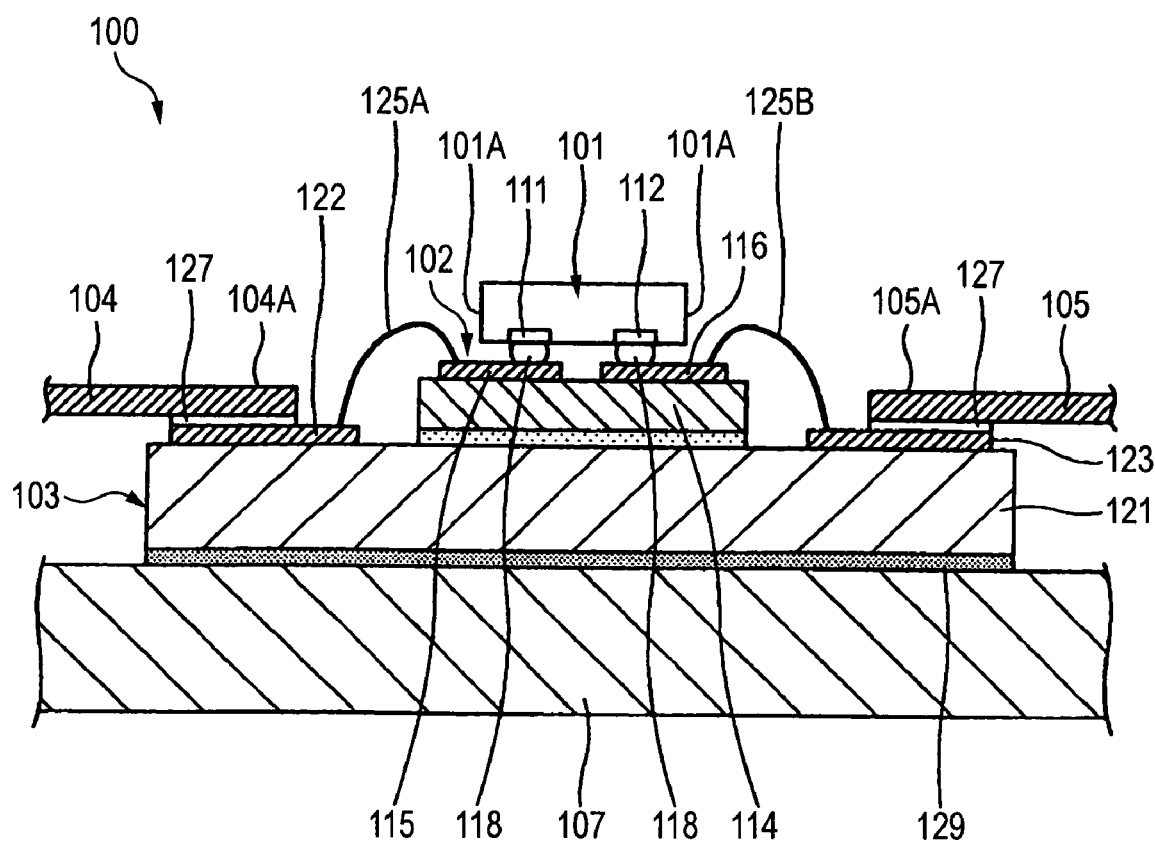
FIG. 1 is a sectional view illustrating a known light-emitting device.

Since the bump 38 and the external connection lead 14 are electrically connected to each other by the first wiring pattern 21 while the bump 39 and the external connection lead 15 are electrically connected to each other by the second wiring pattern 22, wires 125A and 125B (see FIG. 1) provided in the conventional light-emitting device 100 become unnecessary. Accordingly reliability in electrical connection between the light-emitting element 12 and the external connection leads 14 and 15 is enhanced.

In the light-emitting device 10 according to this embodiment, although Ag paste is used as an example of adhesive, other adhesives may be used as long as they are electrically conductive.

In the light-emitting device 10 according to this embodiment, although it has been exemplified that Ag paste is used for making connections between the external connection lead 14 and the first wiring pattern 21 and between the external connection lead 15 and the second wiring pattern 22, such connections also can be attained in an alternative manner without using a conductive adhesive such as Ag paste. For example, as for the alternative manner, the external connection lead 14 and the first wiring pattern 21 can be electrically connected and the external connection lead 14 and the second wiring pattern 22 can be electrically connected. In detail, the wiring substrate 11 and the heat-sinking plate 13 are placed in a casing and a frame-shaped body designed to expose the light-emitting element 12 is pressed against the external connection leads 14 and 15 the frame-shaped body is held by the casing.

Second Embodiment

Figure 3:
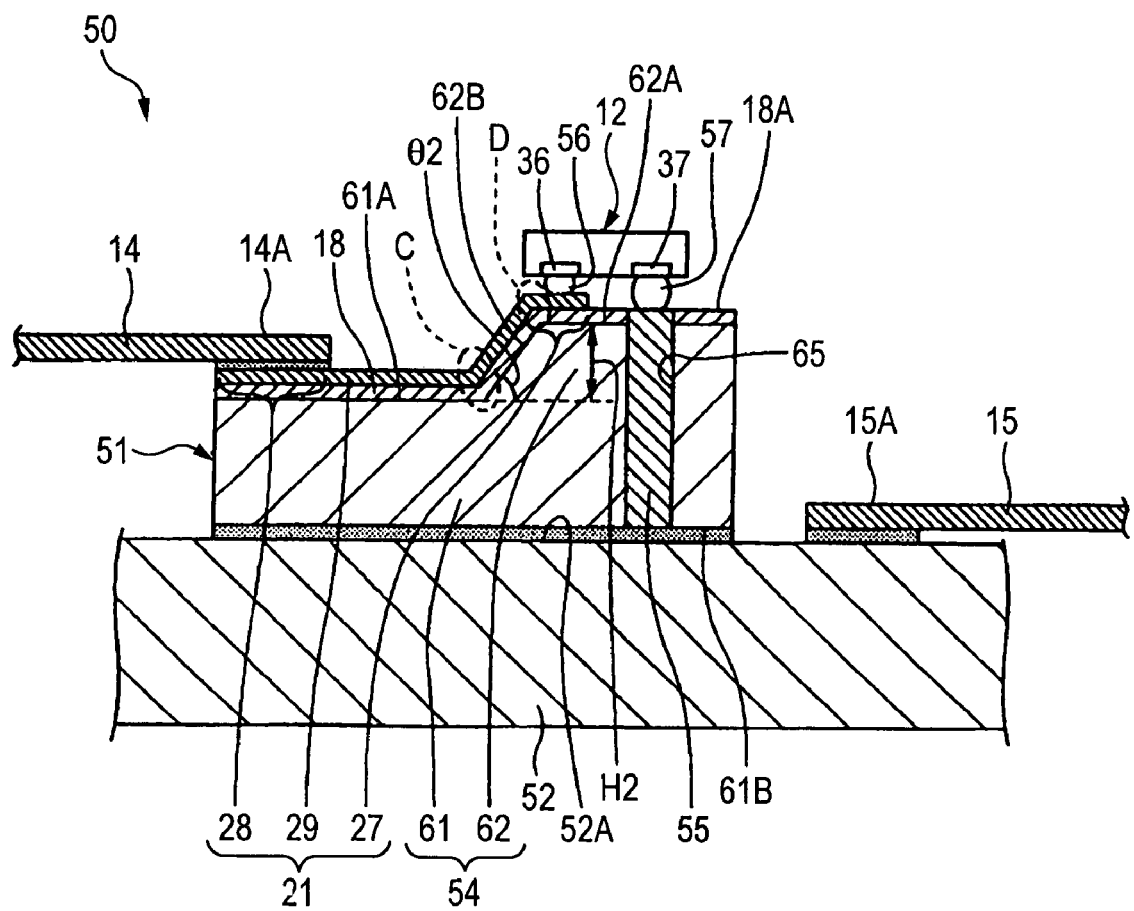
FIG. 3 is a sectional view illustrating a light-emitting device according to a second embodiment of the invention.

FIG. 3 is a sectional view illustrating a light-emitting device according to a second embodiment of the invention.

Referring to FIG. 3, the light-emitting device 50 according to the second embodiment has external connection leads 14 and 15, a wiring substrate 51, a heat-sinking plate 52 and a light-emitting element 12.

The wiring substrate 51 has a substrate body 54, an insulation layer 18, a first wiring pattern 21 and a penetrating electrode 55. The substrate body 54 has a substrate portion 61 and a protruding portion 62. The protruding portion 62 is integrated into the substrate portion 61. The protruding portion 62 is disposed on the top surface 61A of the substrate portion 61 and protrudes from the top surface 61A of the substrate portion 61. The top surface 62A of the protruding portion 62 protrudes higher than the top surface 14A of a portion of the external connection lead, the portion disposed on the first wiring pattern 21.

The protruding portion 62 serves to enable the light-emitting element 12 to protrude higher than the top surface 14A of the portion of the external connection lead 14, the portion disposed on the first wiring pattern 21. A Height H2 (height measured when the top surface 61A of the substrate portion 61 is a base level) of the protruding portion 62 may be about 400 μm.

According to such configurations, on the substrate body 54 there is provided the protruding portion 62 which enables the light-emitting element 12 to protrude higher than the top surface 14A of the portion of the external connection lead 14. In addition, the sub-mount substrate 102 (see FIG. 1) provided in the related-art light-emitting device 100 becomes unnecessary. Accordingly, it is possible to effectively use light emitted from the entire surface of the light-emitting element 12. Further, in the light-emitting device 50, since there is no necessity to use two substrates (the sub-mount substrate 102 and the board substrate 103) unlike the conventional light-emitting device 100 but a single wiring substrate 51 is enough to use, the cost of the light-emitting device 50 can be reduced.

The protruding portion 62 has a side surface 62B on which the insulation layer 18 is formed. The side surface 62B of the protruding portion 62 is an inclined surface inclined at an angle of θ2 with respect to the top surface 61A of the substrate portion 61. The angle θ2 can be, for example, 54.7° or 90°.

Thanks to such configuration in which the side surface 62B of the protruding portion 62 is an inclined surface, stress is not concentrated on a portion of the first wiring pattern 21 which is formed on stepped portions C and D, so that it is possible to prevent the first wiring pattern 21 from breaking (for example, wire disconnection).

The substrate body 51 has a penetrating hole 65 which penetrates the protruding portion 62 and the substrate portion 61 disposed under the protruding portion 62.

A material for the substrate body 54 can be silicon. An advantage of using silicon as a material for the substrate body 54 is that it is easy to form the protruding portion 62 having the inclined side surface 62B.

The insulation layer 18 covers the top surface 61A of the substrate portion 61 and the top surface 62A and the side surface 62B of the protruding portion 62. The insulation layer 18 is a layer for electrically insulating the first wiring pattern 21 from the penetrating electrode 55.

The first wiring pattern 21 includes a light-emitting element connection pad 27, a lead connection portion 28 and a wiring portion 29. The light-emitting element connection pad 27 is disposed on the insulation layer 18 formed on the protruding portion 62. The light-emitting element connection pad 27 is electrically connected to the first power supply terminal 36 of the light-emitting element 12 via a bump 56.

The lead connection portion 28 is disposed on the insulation layer 18 formed on the top surface 61A of the substrate portion 61. The lead connection portion 28 is electrically connected to the external connection lead 14.

The wiring portion 29 is disposed on the insulation layer 18 formed on the side surface 62B of the protruding portion 62 and the top surface 61A of the substrate portion 61. The wiring portion 29 is connected to the light-emitting element connection pad 27 at an end thereof and to the lead connection portion 28 at the other end thereof. The wiring portion 29 serves to electrically connect the light-emitting element connection pad 27 with the lead connection portion 28.

The penetrating electrode 55 is formed in the penetrating hole 65. A top end portion of the penetrating electrode 55 and the top surface 18A of the insulation layer 18 are in almost the same plane. The top end portion of the penetrating electrode 55 is electrically connected to the second power supply terminal of the light-emitting element 12 via a bump 57. A bottom end portion of the penetrating electrode 55 and the bottom surface 61B of the substrate portion 61 are in almost the same plane. The bottom end portion of the penetrating electrode 55 is electrically and thermally connected to the heat-sinking plate 52 having electrical conductivity by using Ag paste as an adhesive.

The penetrating electrode 55 is preferably made of a material having thermal conductivity higher than silicon and having electrical conductivity. In detail, it is possible to use copper Cu as the material for the penetrating electrode 55. The penetrating electrode can be manufactured, for example by using a plating method.

As described above, thanks to the configurations in which the penetrating electrode 55 is formed to penetrate the protruding portion 62 and the substrate portion 61 disposed under the protruding portion 62 and the penetrating electrode 55 is electrically connected to the second power supply terminal 37, the size of the substrate body 54 can be reduced. As a result, the cost of the light-emitting device 50 can be reduced.

In addition, thanks to the configuration in which the penetrating electrode 55 is formed of as a material having thermal conductivity higher silicon and having electrical conductivity, it is possible to effectively transmit heat generated when the light-emitting element 12 emits light to the heat-sinking plate 52.

The heat-sinking plate 52 is attached to the bottom surface 51B of the wiring substrate 51 by using Ag paste as an adhesive. The heat-sinking plate 52 is preferably made of a material having electrical conductivity and high thermal conductivity. For example, a material for the heat-sinking plate 52 can be copper Cu which has high thermal conductivity.

As described above, thanks to the configuration in which the heat-sinking plate 52 is made of a conductive material, it is possible to electrically connect the penetrating electrode 55 with the external connection lead 15.

Thanks to the configuration in which the heat-sinking plate 52 is made of a material having electrical conductivity and high thermal conductivity, it is possible to enhance heat-sinking efficiency of the heat-sinking plate 52.

The external connection lead 14 is attached to the lead connection portion 28 by using Ag paste as an adhesive. Thanks to such configuration, the external connection lead 14 can be electrically connected to the first power supply terminal 36 via the first wiring pattern 21.

The external connection lead 15 is attached to the heat-sinking plate 52 by using Ag paste as an adhesive. Thanks to such configuration, the external connection lead 15 is electrically connected to the second power supply terminal 37 via the heat-sinking plate 52 and the penetrating electrode 55.

The light-emitting element 12 is disposed at the position higher than the top surface 14A of the external connection lead 14 formed on the first wiring pattern 21. Thanks to such configuration in which the light-emitting element 12 is disposed at the position higher than the top surface 14A of the external connection lead 14 formed on the first wiring pattern 21, it is possible to effectively use light emitted from the entire surface of the light-emitting element 12.

The light-emitting element 12 includes the first power supply terminal 36 and the second power supply terminal 37. The first power supply terminal 36 is electrically connected to the light-emitting element connection pad 27 via the bump 56. The second power supply terminal 37 is electrically connected to the penetrating electrode 55 via the bump 57.

In the light-emitting device according to this embodiment, the penetrating electrode 55 which penetrates the protruding portion 62 and the substrate portion 61 disposed under the protruding portion 62 is provided and the penetrating electrode 55 and the second power supply terminal 37 are electrically connected. It is therefore possible to reduce the size of the substrate body 54, resulting in cost reduction of the light-emitting device 50.

The penetrating electrode 55 is made of a material having electrical conductivity and thermal conductivity higher than silicon, it is therefore possible to effectively transmit the heat generated when the light-emitting element 12 emits light to the heat-sinking plate 52.

The light-emitting device 50 according to this embodiment can attain the same advantages as the light-emitting device 10 according to the first embodiment.

Although it has been exemplified that Ag paste is used as an adhesive in the light-emitting device 50 according to this embodiment, another adhesives can be also used as long as they are electrically conductive.

Although it has been exemplified that Ag paste is used in the light-emitting device 50 according to this embodiment in order to make connections between the external connection lead 14 and the first wiring pattern 21 and between the external connection lead 15 and the heat-sinking plate 52, such connections can be realized in an alternative manner. That is, the external connection lead 14 and the first wiring pattern 21 may be electrically connected and the external connection lead 15 and the heat-sinking plate 52 may be made electrically connected, without using a conductive adhesive such as Ag paste. In detail, the wiring substrate 51 and the heat-sinking plate 52 are placed in a casing, a frame-shaped body designed to expose the light-emitting element 12 is pressed against the external connection leads 14 and 15, and the frame body is held by the casing.

Third Embodiment

Figure 4:
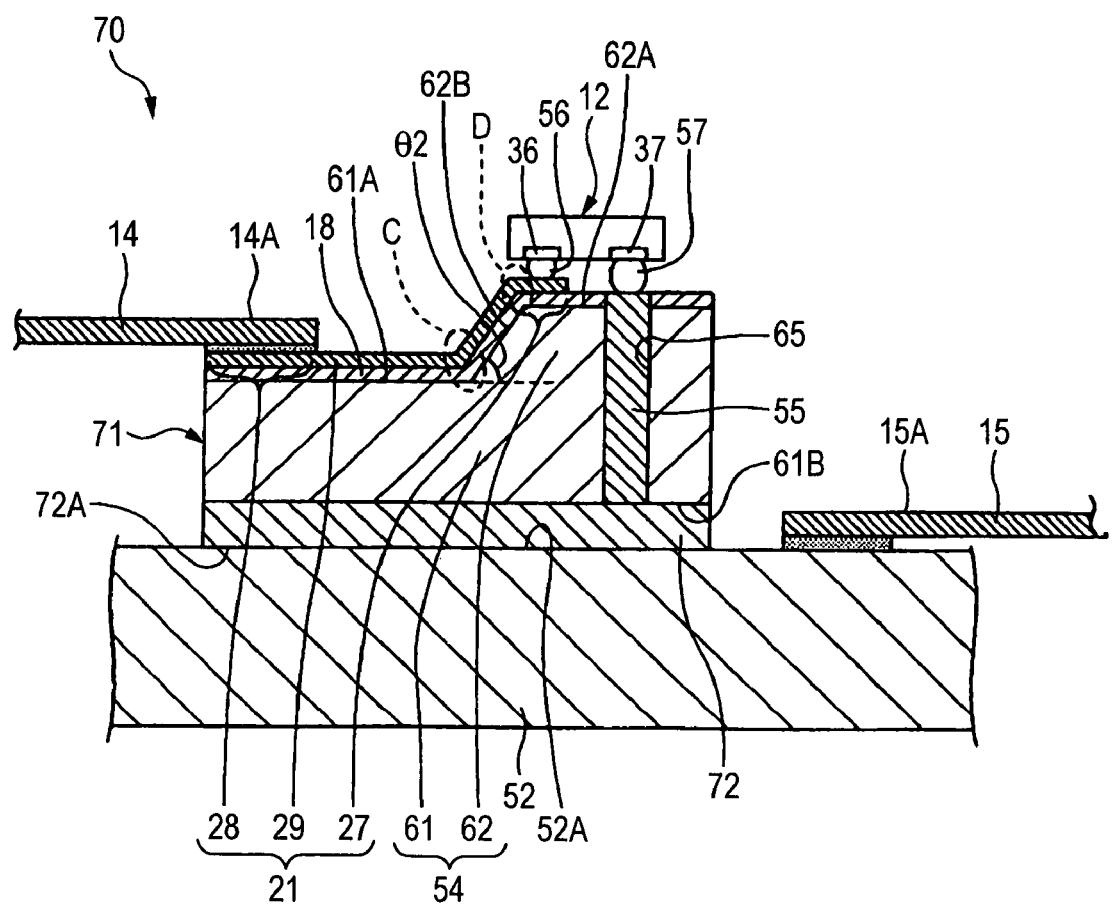
FIG. 4 is a sectional view illustrating a light-emitting device according to a third embodiment of the invention.

FIG. 4 is a sectional view illustrating a light-emitting device according to a third embodiment of the invention.

Referring to FIG. 4, a light-emitting device 70 according to the third embodiment of the invention is configured in the same manner as the light-emitting device 50 according to the second embodiment, except one thing that the wiring substrate 51 in the second embodiment is substituted with a wiring substrate 71.

The wiring substrate 71 is configured in the same manner as the wiring substrate 51 explained with reference to the second embodiment, except one thing that the wiring substrate 71 additionally includes a metal layer in.

The metal layer 72 is made of a metal having high thermal conductivity. The metal layer 72 is formed on the bottom surface 61B of a substrate portion 61. The metal layer 72 is connected to a lower end portion of a penetrating electrode 55. Thanks to such configuration, the metal layer 72 is electrically and thermally connected to a second power supply terminal 37 via the penetrating electrode 55.

The metal layer is fixed to the heat-sinking plate 52 by using Ag paste as an adhesive. That is, the metal layer 72 is disposed between the substrate portion 61 and the heat-sinking plate 52. Thanks to such configuration, the heat-sinking plate is electrically and thermally connected to the second power supply terminal of the light-emitting element 12. The metal layer 72 can be made of copper Cu. The metal layer 72 can be manufactured for example by using a plating method. A thickness of the metal layer may be about 5 µm.

In the light-emitting device according to this embodiment, the metal layer 72 having high thermal conductivity and connected to the penetrating electrode 55 is provided between the substrate portion 61 and the heat-sinking plate 52. It is therefore possible to transmit the heat generated when the light-emitting element 12 emits light to the heat-sinking plate 51, so that heat-sinking efficiency can be enhanced.

Although it has been exemplified that the metal layer 72 is fixed to the heat-sinking plate 52 using Ag paste as an adhesive, the metal layer may be fixed to the heat-sinking plate 52 by using a direct bonding method without using Ag paste. For example, in the direct bonding method, the bottom surface 72A of the metal layer 72 and the top surface 52A of the heat-sinking plate are activated by plasma to be smooth and flat, then the bottom surface 72A of the metal layer 72 is pressed against the top surface 52A of the heat-sinking plate 52, and finally the metal layer 72 and the heat-sinking plate 52 are bonded. In this incidence, the metal layer 72 and the heat-sinking plate 52 may be heated so as to be bonded.

In the case in which the metal layer 72 is fixed to the heat-sinking plate 52 by using such direction bonding method, Ag paste which has poor thermal conductivity becomes unnecessary. In addition, since the metal layer 72 and the heat-sinking plate 52 are in direct contact with each other, it is therefore possible to effectively release the heat generated when the light-emitting element 12 emits light.

Although it has been exemplified that Ag paste is used as an adhesive in the light-emitting device 70 according to this embodiment, another adhesives also may be used as long as they are electrically conductive.

In the light-emitting device 70 according to this embodiment, although Ag paste is used to connect the external connection lead 14 with the first wiring pattern 21 and connect the external connection lead 15 with the heat-sinking plate 52, such connections can be achieved in an alternative manner. For example, the external connection lead 14 and the first wiring pattern 21 may be electrically connected and also the external connection lead 15 and the heat-sinking plate 52 may be electrically connected without using a conductive adhesive such as Ag paste. In detail, the wiring substrate 71 and the heat-sinking plate 52 are placed in a casing, a frame body designed to expose the light-emitting element 12 is pressed against the external connection leads 14 and 15, and the frame body is held by the casing.

Although the preferred embodiments of the invention has been shown and described above, it will be apparent to those having ordinary skill in the art that the invention is not limited to the specific embodiments described above but a number of changes, modifications or alternations to the embodiments may be made within the spirit of the invention, which is defined in claims.

The invention can be applied to light-emitting devices which can effectively use light emitted from the entire surface of light-emitting elements and can reduce the cost thereof.

What is claimed is:

1. A light-emitting device, comprising:
   a light-emitting element,
   a substrate body having a protruding portion at a position where the light-emitting element is disposed, the protruding portion extending the length of the light-emitting element, and
   a wiring substrate provided on the substrate body, the wiring substrate including a wiring pattern having a light-emitting element connection pad electrically connected to the light-emitting element at a first end thereof and a lead connection portion electrically connected to an external connection lead at a second end thereof, wherein
   the protruding portion has a shape of which a width decreases from a lower portion to an upper portion thereof, a side surface of the protruding portion being an inclined surface,
   the light-emitting element connection pad is formed on the upper portion of the protruding portion, and
   the light-emitting element connection pad and the lead connection portion are continuous from the upper portion of the protruding portion along the side surface of the protruding portion.

2. The light-emitting device according to claim 1, wherein
   the wiring pattern is disposed on a surface of the substrate body on which the light-emitting element is disposed, and
   the protruding portion protrudes higher than a top surface of a portion of the external connection lead, the portion being disposed on the substrate body.

3. The light-emitting device according to claim 1, further comprising:
   a heat-sinking plate provided on a surface of the substrate body opposite to the surface on which the protruding portion is disposed.

4. The light-emitting device according to claim 1, wherein the substrate body is made of silicon.

5. The light-emitting device according to claim 1, wherein the side surface of the protruding portion is inclined at 54.7° with respect to the top surface of the substrate portion.

* * * * *